(12) United States Patent
Liu et al.

(10) Patent No.: US 11,031,057 B2
(45) Date of Patent: Jun. 8, 2021

(54) MODE CONVERSION METHOD AND APPARATUS FOR A NONVOLATILE MEMORY

(71) Applicants: GigaDevice Semiconductor (Beijing) Inc., Beijing (CN); GigaDevice Semiconductor (XiAn) Inc., Xi'an (CN); GigaDevice Semiconductor (Shanghai) Inc., Shanghai (CN)

(72) Inventors: Daping Liu, Beijing (CN); Ronghua Pan, Beijing (CN)

(73) Assignees: Gigadevice Semiconductor (Beijing) Inc., Beijing (CN); Gigadevice Semiconductor (Xian) Inc., Xi'An (CN); Gigadevice Semiconductor (Shanghai) Inc., Shanghai (CN)

( * ) Notice: Subject to any disclaimer, the term of this patent is extended or adjusted under 35 U.S.C. 154(b) by 0 days.

(21) Appl. No.: 16/713,165

(22) Filed: Dec. 13, 2019

(65) Prior Publication Data

US 2020/0202913 A1 Jun. 25, 2020

(30) Foreign Application Priority Data

Dec. 25, 2018 (CN) .......................... 201811594327.0

(51) Int. Cl.
| | |
|---|---|
| *G11C 8/00* | (2006.01) |
| *G11C 8/16* | (2006.01) |
| *G11C 8/12* | (2006.01) |
| *G06F 13/16* | (2006.01) |
| *G11C 11/408* | (2006.01) |
| *G06F 12/02* | (2006.01) |
| *G11C 11/4096* | (2006.01) |

(52) U.S. Cl.
CPC ............ *G11C 8/16* (2013.01); *G06F 12/0246* (2013.01); *G06F 13/1668* (2013.01); *G11C 8/12* (2013.01); *G11C 11/4082* (2013.01); *G11C 11/4096* (2013.01)

(58) Field of Classification Search
CPC ......... G11C 8/16; G11C 8/12; G11C 11/4082; G11C 11/4096; G11C 2207/108; G11C 2207/105; G11C 7/1051; G11C 7/1078; G11C 7/1048; G11C 16/06; G06F 13/1668; G06F 12/0246; G06F 2212/202; G06F 2212/1004; G06F 12/0623
USPC .................................................. 365/230.05
See application file for complete search history.

(56) References Cited

U.S. PATENT DOCUMENTS

| | | | | |
|---|---|---|---|---|
| 5,473,758 A | * | 12/1995 | Allen .................... | G11C 16/102 365/52 |
| 5,966,723 A | * | 10/1999 | James .................... | G11C 16/10 711/103 |
| 6,965,964 B2 | * | 11/2005 | Lee ....................... | G11C 7/1078 365/185.33 |

FOREIGN PATENT DOCUMENTS

CN  101315807  12/2008

* cited by examiner

*Primary Examiner* — Tha-O H Bui
(74) *Attorney, Agent, or Firm* — Don V. Kelly; Evans & Dixon, L.L.C.

(57) ABSTRACT

An X16 nonvolatile memory has 16 input/output (I/O) ports, identified as I/O ports [15:0], and adopts a conversion method, which allows the memory to operate in an X16 mode or in an X8 mode. The method includes receiving a first user command that is sent by an upper computer and belongs to a user mode; determining a disabling command for a module path of the high-bit I/O ports [15:8] according to the first user command; and executing the disabling command and disabling the module path for controlling the high-bit I/O ports [15:8] of the memory so as to operate in an X8 mode.

11 Claims, 4 Drawing Sheets

MODE CONVERSION METHOD AND APPARATUS FOR A NONVOLATILE MEMORY

CROSS-REFERENCE TO RELATED APPLICATIONS

This application claims priority to a Chinese patent application No. 201811594327.0 filed on Dec. 25, 2018, the disclosure of which is incorporated herein by reference in its entirety.

TECHNICAL FIELD

The present disclosure relates to the field of nonvolatile memories and, in particular, to a mode conversion method and a mode conversion apparatus for a nonvolatile memory.

BACKGROUND

Data of the nonvolatile memory is stored in storage cells, and each storage cell stores one or more bits. For the single-level cell (SLC) memory, one cell stores one bit, and a byte string includes 8 or 16 cells. A page includes multiple byte strings. The read operation and write operation of the nonvolatile memory are performed in pages. In the user manual of the nonvolatile memory, it is specified that if the byte string includes 8 storage cells, the nonvolatile memory has 8 input/output ports, I/O ports [7:0], for data transmission, and data width is 8 bits, and such nonvolatile memory is referred to as an X8 mode. If the byte string includes 16 storage cells, the nonvolatile memory has 16 input/output ports, I/O ports [15:0], for data transmission, and the data width is 16 bits, and such nonvolatile memory is referred to as an X16 mode.

In the related art, when a nonvolatile memory is operating, the nonvolatile memory is operating in a determined mode, either the X8 mode or the X16 mode. The user needs to select the mode of the firmware according to whether the nonvolatile memory is in the X8 mode or the X16 mode. Since X16 the nonvolatile memory has 16 I/O ports, the data is inputted and outputted through the 16 I/O ports and the X16 nonvolatile memory corresponds to a controller in the X16 firmware. For the controller of the X8 firmware, data is inputted and outputted through the 8 I/O ports (namely, I/O ports [7:0]) of the X8 nonvolatile memory. When an internal designer or engineer, for whom a test mode is available, needs to control the X16 nonvolatile memory by using the controller of the X8 firmware, the internal designer or engineer can make the X16 nonvolatile memory operate in the test mode and convert the nonvolatile memory from the X16 mode to the X8 mode by a test command.

However, when the ordinary user needs to control the X16 nonvolatile memory by using the controller of the X8 firmware, the X8 firmware does not have pins corresponding to the high-bit I/O ports [15:8] of the X16 nonvolatile memory, so the X16 nonvolatile memory cannot be used with the controller of the X8 firmware. For the ordinary user, the X16 nonvolatile memory cannot operate in the X8 mode, causing the user, who only has the X8 firmware, to be unable to use the nonvolatile memory that is only configured in the X16 mode.

SUMMARY

In view of the above problems, the present disclosure provides a mode switching method and apparatus for a nonvolatile memory, which solves the problem for the user who only has the firmware of the X8 mode and cannot use the nonvolatile memory that is only configured in the X16 mode.

The embodiment of the present disclosure provides a mode switching method for a nonvolatile memory. The nonvolatile memory is configured in the X16 mode and has 16 I/O ports, identified as I/O ports [15:0]. The I/O ports [15:8] are high-bit I/O ports, and I/O ports [7:0] are low-bit I/O ports. The method includes the following steps:

receiving a first user command that is sent by an upper computer and that belongs to a user mode; determining a disabling command for a module path of the high-bit I/O ports [15:8] according to the first user command; and executing the disabling command and disabling the module path for controlling the high-bit I/O ports [15:8] of the X16 nonvolatile memory to make the X16 nonvolatile memory operate in the X8 mode.

In one or more embodiments, the steps of determining the disabling command for the module path of the high-bit I/O ports [15:8] according to the first user command and executing the disabling command to disable the module path for controlling the high-bit I/O ports [15:8] of the X16 nonvolatile memory to make the X16 nonvolatile memory operate in the X8 mode include:

parsing the first user command to obtain an address and a command for invoking a path disabling instruction;

acquiring an address where the path disabling instruction is stored according to the address, and invoking the path disabling instruction, where the path disabling instruction is used for sending a disabling signal for disabling the module path of the high-bit I/O ports [15:8] of the X16 nonvolatile memory; and disabling the module path of the high-bit I/O ports [15:8] through the disabling signal.

In one or more embodiments, after the module path for controlling the high-bit I/O ports [15:8] of the nonvolatile memory is disabled, the read operation and the write operation of the nonvolatile memory are implemented through the low-bit I/O ports [7:0]. After the X16 nonvolatile memory is converted into the X8 mode, the method further includes:

receiving a second user command that is sent by the upper computer and that belongs to the user mode;

determining an enabling command for the module path of the high-bit I/O ports [15:8] according to the second user command; and executing the enabling command to enable the module path of the high-bit I/O ports [15:8] of the X16 nonvolatile memory, such that the X16 nonvolatile memory that has been converted to the X8 mode is converted back to the X16 mode.

In one or more embodiments, after controlling the X16 nonvolatile memory to be converted into the X8 mode, the method further includes:

when the X16 nonvolatile memory is powered off, enabling the module path for controlling the high-bit I/O ports [15:8] in the X16 nonvolatile memory to convert the X16 nonvolatile memory that had been converted to the X8 mode back to the X16 mode.

The embodiment of the present disclosure further provides a mode conversion apparatus for the nonvolatile memory. The nonvolatile memory is of the X16 mode and has 16 I/O ports, identified as I/O ports [15:0]. The I/O ports [15:8] are high-bit I/O ports, and the I/O ports [7:0] are low-bit I/O ports. The apparatus includes: a first receiving module, a first determining module, and a first executing module;

The first receiving module is configured to receive a first user command that is sent by an upper computer and belongs to a user mode.

The first determining module is configured to determine a disabling command for a module path of the high-bit I/O ports [15:8] according to the first user command.

The first executing module is configured to execute the disabling command to disable the module path for controlling the high-bit I/O ports [15:8] in the X16 nonvolatile memory to make the X16 nonvolatile memory operate in an X8 mode.

In one or more embodiments, the first determining module includes: a parsing submodule and an addressing and invoking submodule.

The parsing submodule is configured to parse the first user command to obtain an address and a command for invoking a path disabling instruction.

The addressing and invoking submodule is configured to acquire, according to the address, an address where the path disabling instruction is stored, and invoke the path disabling instruction, where the path disabling instruction is used for sending a disabling signal for disabling the module path of the high-bit I/O ports [15:8] in the X16 nonvolatile memory.

In one or more embodiments, the apparatus further includes: a second receiving module, a second determining module and a second executing module.

The second receiving module is configured to receive a second user command that is sent by the upper computer and belongs to the user mode.

The second determining module is configured to determine an enabling command for the module path of the high-bit I/O ports [15:8] according to the second user command.

The second executing module is configured to execute the enabling command to enable the module path for controlling the high-bit I/O ports [15:8] in the X16 nonvolatile memory, such that the X16 nonvolatile memory that has been converted into the X8 mode is converted back to the X16 mode.

The present disclosure provides a mode conversion method and a mode conversion apparatus of a nonvolatile memory. The path disabling instruction is triggered by the first user command in the user mode, and the module path for controlling the high-bit I/O ports [15:8] of the X16 nonvolatile memory is disabled, so that data transmission and reception are both implemented via the low-bit I/O ports [7:0], and the user with the X8 firmware can use the X16 nonvolatile memory.

BRIEF DESCRIPTION OF THE DRAWINGS

Through reading the detailed description of the embodiments below, various other advantages and benefits will become apparent to the person having ordinary skill in the art. The drawings are only for the purpose of illustrating the embodiments described below and are not intended to limit the present disclosure. Throughout the drawings, the same reference number refers to the same part. In the drawings.

DETAILED DESCRIPTION

To make the above objects, features and advantages of the present disclosure more apparent and comprehensible, the present invention will be further described in detail with reference to the accompanying drawings and specific embodiments. It is to be understood that the specific embodiments described herein are merely used to illustrate the present disclosure, are only a part of the embodiments of the present disclosure and not all embodiments. As such, the described embodiments are not intended to limit the present disclosure.

Figure 1:
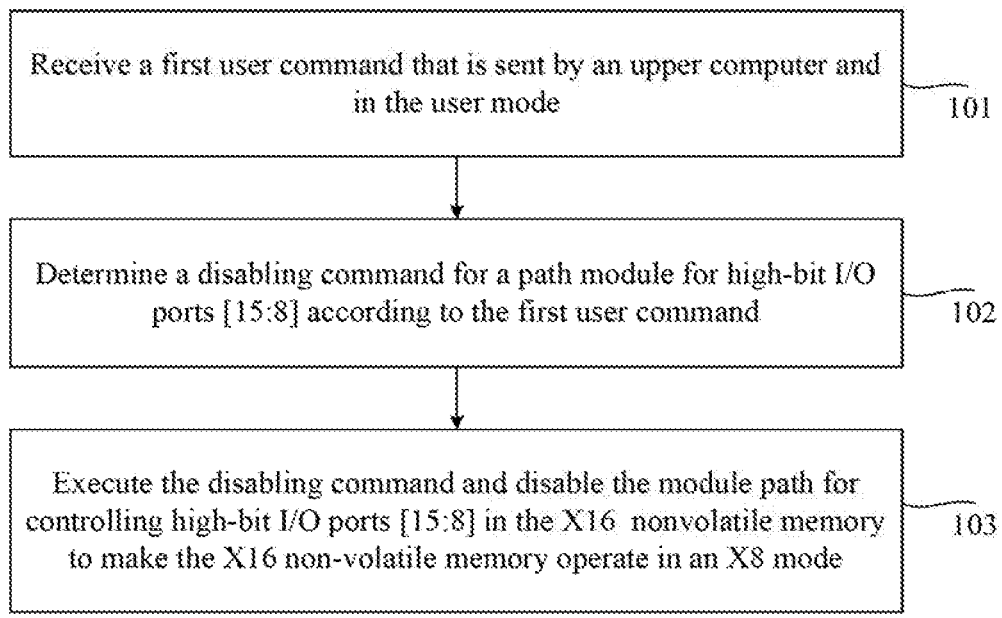
FIG. 1 is a flowchart of a mode conversion method for a nonvolatile memory according to an embodiment of the present disclosure.

FIG. 1 shows a flowchart of a mode conversion method for a nonvolatile memory. The nonvolatile memory operates in the X16 mode. All data transmission of the X16 nonvolatile memory is implemented through I/O ports of the nonvolatile memory. The X16 nonvolatile memory has 16 I/O ports, identified as I/O ports [15:0]. The I/O ports [15:8] are high-bit I/O ports and the I/O ports [7:0] are low-bit I/O ports. The mode conversion method for the nonvolatile memory may include the following steps:

In step 101, a first user command in a user mode sent by an upper computer is received. The user mode is different from the test mode. The test mode is available to the engineer of the manufacturer of the nonvolatile memory and is not available to the user (purchaser) of the nonvolatile memory.

In the embodiments of the present disclosure, the data transmission and data reception of the X16 nonvolatile memory are implemented through 16 I/O ports, that is, I/O ports [15:8]. However, the pure operation commands, such as the read operation command, the programming operation command, etc., are transmitted via the low-bit I/O ports, that is, I/O ports [7:0]. Therefore, when the X8 firmware is connected to the X16 nonvolatile memory, the upper computer can send the operation command to the X16 nonvolatile memory, that is, in the user mode, the user can send the preset first user command to the X16 nonvolatile memory through the host computer. The specific manner of receiving the preset command for the mode conversion is not limited in the embodiment of the present disclosure.

In step 102, a disabling command for a module path for the high-bit I/O ports [15:8] is determined according to the first user command.

In step 103, the disabling command is executed to disable the module path for controlling the high-bit I/O ports [15:8] in the X16 nonvolatile memory, such that the X16 nonvolatile memory is converted to the X8 mode for operation.

Figure 3:
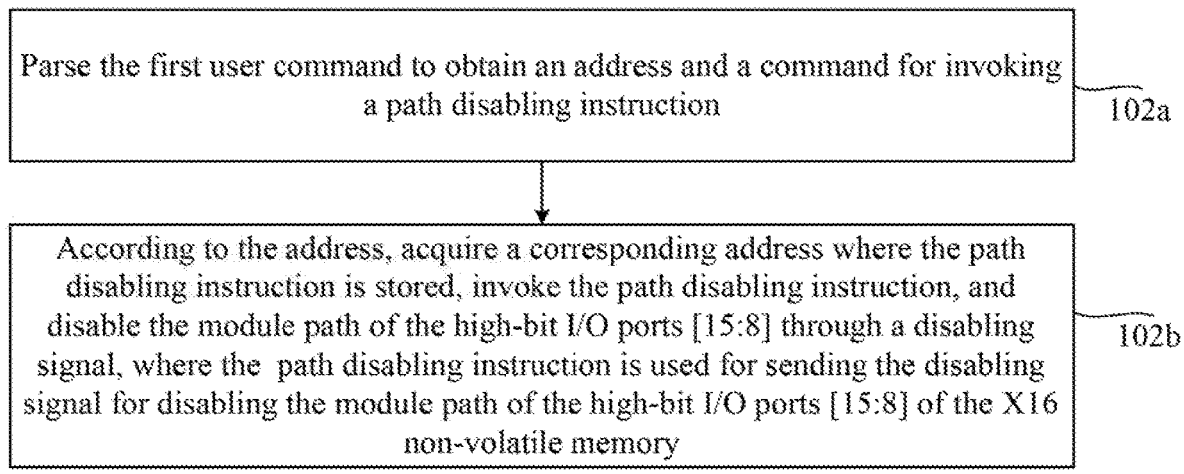
FIG. 3 is a flowchart of one step of a mode conversion method for a nonvolatile memory according to an embodiment of the present disclosure.

With reference to FIG. 3, the step 102 and step 103 may further include the steps described below:

In step 102*a*, an address and a command for invoking a path disabling instruction are obtained by parsing the first user command.

In step 102*b*, an address of a position where the path disabling instruction is stored is acquired according to the address, the path disabling instruction is invoked, and the module path of the high-bit I/O ports [15:8] is disabled by a disabling signal. The path disabling instruction is used for sending the disabling signal for disabling the module path of the high-bit I/O ports [15:8] in the X16 nonvolatile memory.

In the embodiment of the present disclosure, the internal designer or engineer, whom the test mode is available to, can set the X16 nonvolatile memory in the test mode and send the path disabling instruction. The path disabling instruction is used for sending the disabling signal for disabling the module path of the high-bit I/O ports [15:8] of the X16 nonvolatile memory. The first user command preset for the user includes a command for invoking the path disabling instruction and an address for invoking the path disabling instruction, where the path disabling instruction is stored in a position indicated by the address. The path disabling instruction can be addressed according to the address, and therefore the path disabling instruction can be invoked. When the path disabling instruction is invoked, the disabling signal is sent and controls the module path of the high-bit I/O ports [15:8] to be disabled. In this way, the data transmission and data reception of the X16 nonvolatile memory are implemented by the low-bit I/O ports [7:0], and the X16 nonvolatile memory can be used as the X8 nonvolatile memory by the X8 firmware.

Figure 2:
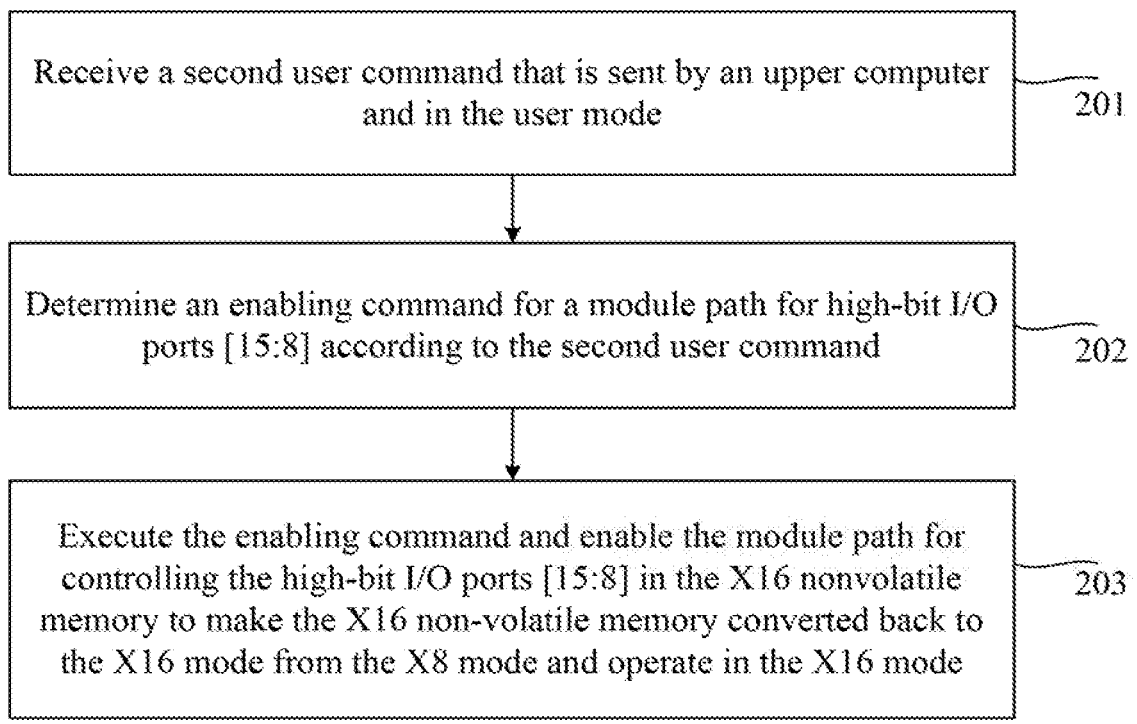
FIG. 2 is another flowchart of a mode conversion method for a nonvolatile memory according to an embodiment of the present disclosure.

FIG. 2 shows a flowchart of another mode conversion method for the X16 nonvolatile memory according to one or more embodiments. After the X16 nonvolatile memory is converted into the X8 mode, the method specifically includes the following steps.

In step 201, a second user command in the user mode sent by the upper computer is received.

In step 202, an enabling command for the module path of the high-bit I/O ports [15:8] is determined according to the second user command.

In step 203, the enabling command is executed and the module path for controlling the high-bit I/O ports [15:8] of the X16 nonvolatile memory is enabled to restore the X16 nonvolatile memory to the X16 mode from the X8 mode.

In the embodiment of the present disclosure, when the user sends the second user command, the command can trigger an enable signal for enabling the high-bit I/O ports [15:8] of the X16 nonvolatile memory. In the case where the module path for controlling the high-bit I/O ports [15:8] in the X16 nonvolatile memory is disabled, upon receiving the enable signal for enabling the module path, the module path in the X16 nonvolatile memory for controlling the high-bit I/O ports [15:8] will be enabled again. At this moment, the X16 nonvolatile memory that has been converted to the X8 mode is converted back to the X16 mode. The specific manner of converting the X16 nonvolatile memory from the X8 mode to the X16 nonvolatile memory is not limited in the embodiment of the present disclosure.

In one or more embodiments, after the X16 nonvolatile memory is converted to the X8 nonvolatile memory, if the X16 nonvolatile memory is powered off, the module path for controlling the high-bit I/O ports [15:8] in the X16 nonvolatile memory will be enabled to convert the X16 nonvolatile memory which has been converted to the X8 mode back to the X16 mode.

In one or more embodiments, when the X16 nonvolatile memory operates in the X16 mode and the preset first user command sent by the upper computer for mode conversion is received, the module path for controlling the high-bit I/O ports [15:8] in the X16 nonvolatile memory is maintained to be enabled, and the nonvolatile memory still operates in the X16 mode.

In an exemplary embodiment, when the controller of the X8 firmware is connected to the X16 nonvolatile memory by the user, the user sends the preset first user command to the X16 nonvolatile memory through the upper computer, and the first user command is inputted to the X16 nonvolatile memory via the low-bit I/O ports [7:0] of the X16 nonvolatile memory. The preset first user command includes the address and the command for invoking the path disabling instruction. The preset first user command is parsed. According to the address in the first user command, the corresponding address where the path disabling instruction is stored is determined, and then, the path disabling instruction is invoked. The path disabling instruction is used for sending a disabling signal for disabling the module path of the high-bit I/O ports [15:8] of the X16 nonvolatile memory. After the disabling signal is transmitted, the module path for controlling high-bit I/O ports [15:8] of the X16 nonvolatile memory is disabled. The data transmission and data reception of the nonvolatile memory are implemented by the low-bit I/O ports [7:0], and the high-bit I/O ports [15:8] are no longer used for the data transmission and reception. That is, the X16 nonvolatile memory is converted to the X8 nonvolatile memory, so the user can control the X16 nonvolatile memory by using the controller of the X8 firmware. It can be understood that the embodiment of the present disclosure does not limit the manner how to disable the module path of the high-bit I/O ports [15:8] of the X16 nonvolatile memory. All of the manners of disabling the module path of the high-bit I/O ports [15:8] of the X16 nonvolatile memory are within the scope of the present disclosure.

When the X16 nonvolatile memory which has been converted into the X8 mode operates, the module path for controlling the high-bit I/O ports [15:8] in the X16 nonvolatile memory is already disabled. The preset second user command is received. The preset second user command is used for sending an enable signal for enabling the module path of the high-bit I/O ports [15:8] in the X16 nonvolatile memory. Upon receiving the enable signal, the module path in the X16 nonvolatile memory for controlling the high-bit I/O ports [15:8] will be enabled. The nonvolatile memory that has been converted to the X8 mode will be reconverted to the X16 mode. When the controller of the X16 firmware is connected to the X16 nonvolatile memory and the X16 nonvolatile memory operates in the X16 mode, if the X16 nonvolatile memory receives the preset command transmitted by the upper computer for the mode conversion, the module path for controlling the high-bit I/O ports [15:8] in the X16 nonvolatile memory is maintained enabled, and the nonvolatile memory still operates in the X16 mode. In addition, after the X16 nonvolatile memory is converted to the X8 mode, if the X16 nonvolatile memory is powered off, the module path for controlling the high-bit I/O ports [15:8] in the X16 nonvolatile memory will be enabled, and the X16 nonvolatile memory that has been converted to the X8 mode is converted back to the X16 mode again.

Figure 4:
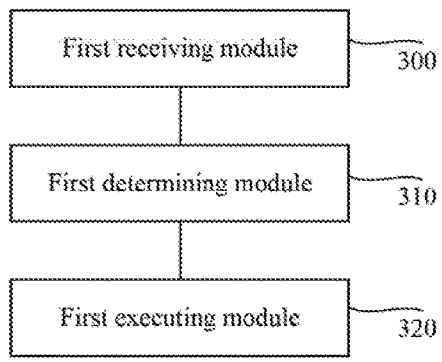
FIG. 4 is a block diagram of a mode conversion apparatus for a nonvolatile memory according to an embodiment of the present disclosure.

FIG. 4 shows a block diagram of a mode conversion apparatus for a X16 nonvolatile memory. All data transmission and reception of the X16 nonvolatile memory are implemented through the I/O ports of the nonvolatile memory. The X16 nonvolatile memory has 16 I/O ports, which include I/O ports [15:0]. Herein, the I/O ports [15:8] are high-bit I/O ports and the I/O ports [7:0] are low-bit I/O ports. The mode conversion apparatus includes a first receiving module 300, a first determining module 310, and first executing module 320.

The first receiving module 300 is configured to receive a first user command in a user mode, where the first user command is sent by an upper computer.

The first determining module 310 is configured to determine a shutdown command for a module path of the high-bit I/O ports [15:8] according to the first user command; and The first executing module 320 is configured to execute the shutdown command and disable the module path for controlling the high-bit I/O ports [15:8] in the X16 nonvolatile memory to make the X16 nonvolatile memory operate in an X8 mode.

Figure 5:
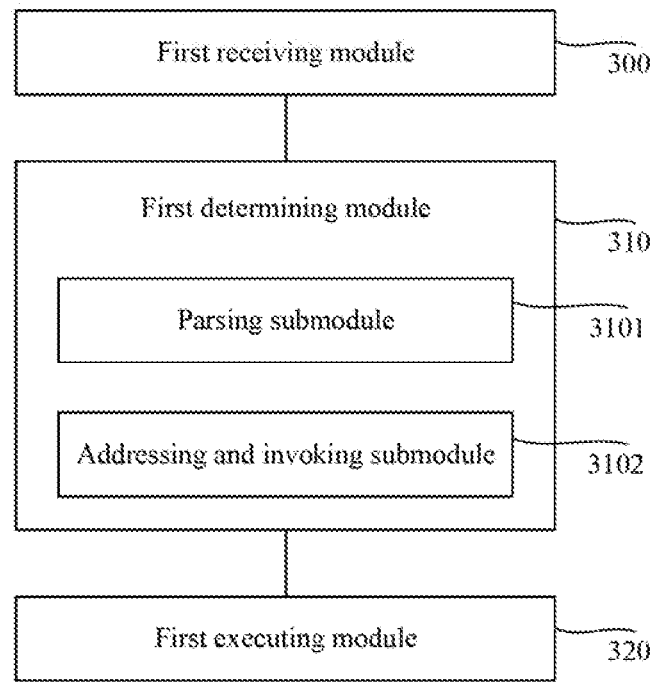
FIG. 5 is a block diagram of another mode conversion apparatus for a nonvolatile memory according to an embodiment of the present disclosure.

In one or more embodiments, as shown in FIG. 5, on the basis of FIG. 4, the above-mentioned apparatus may further include: a first determining module 310.

The first determining module 310 includes: a parsing submodule 3101 and an addressing and invoking submodule 3102.

The parsing submodule 3101 is configured for parsing the first user command to obtain an address and a command for invoking a path disabling instruction.

The addressing and invoking module 3102 is configured to acquire, according to the address, an address where the path disabling instruction is stored, and invoke the path disabling instruction. The path disabling instruction is used for sending an enable a signal for disabling the module path of the high-bit I/O ports [15:8] of the X16 nonvolatile memory.

Figure 6:
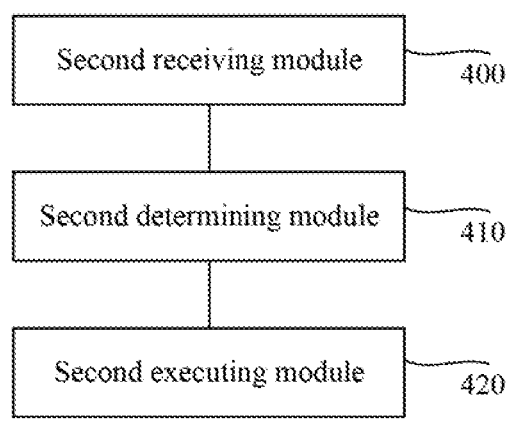
FIG. 6 is a block diagram of yet another mode conversion apparatus for a nonvolatile memory according to an embodiment of the present disclosure.

In one or more embodiments, FIG. 6 shows a block diagram of another mode conversion apparatus of the nonvolatile memory. As shown in FIG. 6, the apparatus further includes a second receiving module 400, a second determining module 410, and a first executing module 420.

The second receiving module 400 is configured to receive a second user command in the user mode, where the second user command is sent by the upper computer.

The second determining module 410 is configured to determine an enabling command for the module path for the high-bit I/O ports [15:8] according to the second user command.

The first executing module 420 is configured to execute the enabling command and enable the module path for controlling the high-bit I/O ports [15:8] of the X16 nonvolatile memory to make the X16 nonvolatile memory be converted back to the X16 mode from the X8 mode and operate in the X16 mode.

Figure 7:
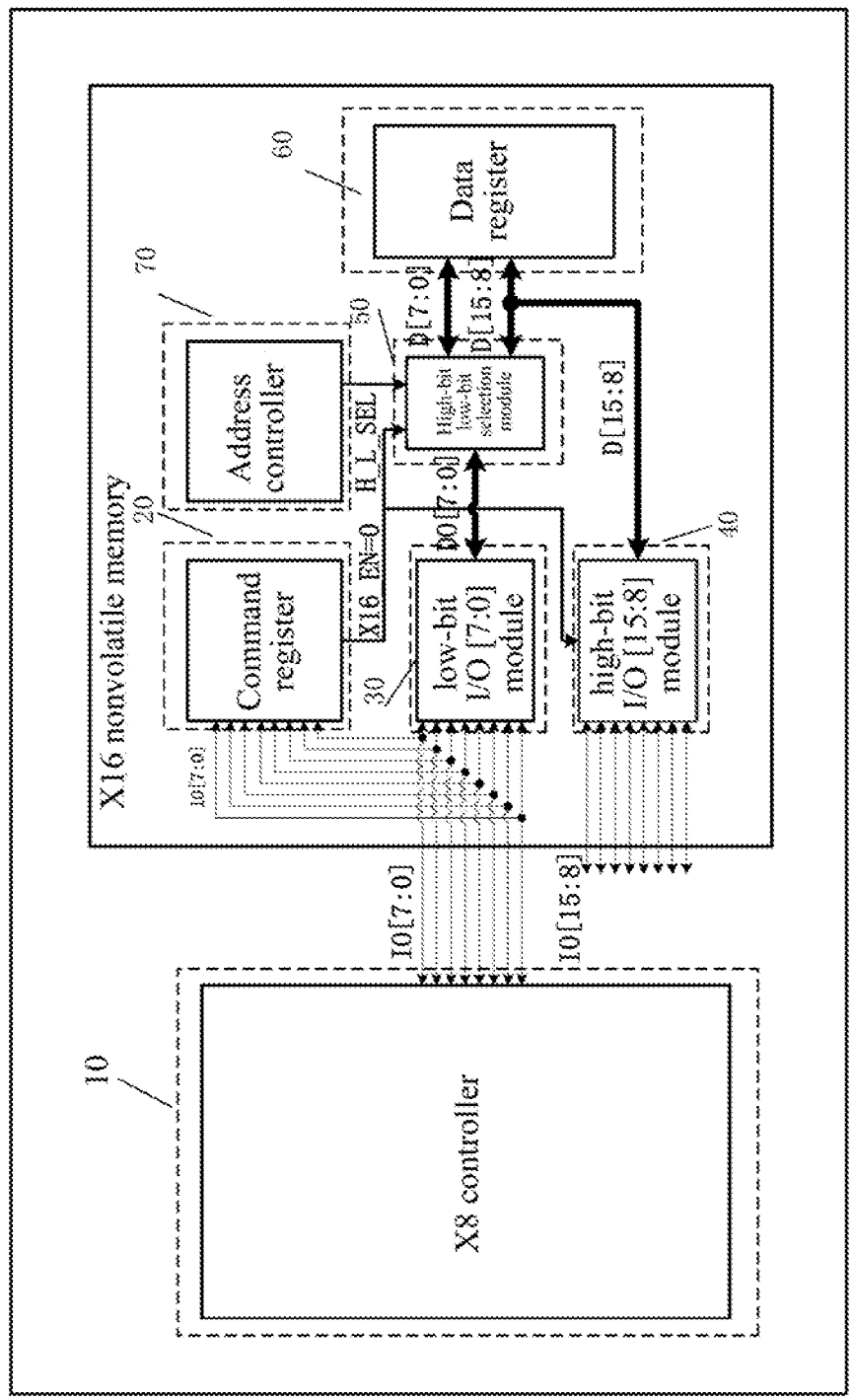
FIG. 7 is a diagram showing the X16 nonvolatile memory operating with an X8 firmware.

In an exemplary embodiment, FIG. 7 shows a specific application of the embodiment of the present disclosure. In FIG. 7, an X8 controller 10 is used by the user, and the user also needs to use the X16 nonvolatile memory. A command register 20 is configured to receive various commands and addresses, and store preset instructions. A low-bit I/O ports [7:0] module 30 is configured to control the enabling and disabling of the I/O ports [7:0]. A high-bit I/O ports [15:8] module 40 is configured to control the enabling and disabling of the I/O ports [15:8]. A high and low selection module 50 (H_L_SEL) is configured to determine whether the data transmission is through the high bits or low bits. A data register 60 is used for storing data of the nonvolatile memory. An address controller 70 is configured for controlling the address of the data in the data register 60. The X16 nonvolatile memory can transmit data simultaneously via the lower-bit I/O ports [7:0] and the high-bit I/O ports [15:8] according to the address of the data. When the X16 nonvolatile memory operates with I/O ports [15:8] being disabled, the address controller 70 is configured to sort data originally transmitted by the low-bit I/O ports [7:0] and the data, originally transmitted by the high-bit I/O ports [15:8] according to the data addresses, such that all the data sequentially enters the high and low selection module 50 (H_L_SEL). In the case where the X16 nonvolatile memory is connected to the X8 controller 10, the user sends the preset first user command to the X16 nonvolatile memory through the X8 controller 10. The preset first user command is inputted into the command register 20 and includes an address and a command for invoking the path disabling instruction. The command register 20 parses the preset first user command, and determines, according to the address in the command, the corresponding address where path disabling instruction is stored. Then, the command register 20 invokes the path disabling instruction. The path disabling instruction is configured to implement the transmitting of the enable signal X16_EN=0 that controls the high-bit I/O ports [15:8] module 40 in the X16 nonvolatile memory to be disabled. The high and low selection module 50 (H_L_SEL) and the high-bit I/O ports [15:8] module 40 receive the signal. The high-bit I/O ports [15:8] module 40 disables the path, and data cannot be transmitted through the high-bit I/O ports [15:8]. In this way, the address controller 70 sorts the data originally transmitted through the low-bit I/O ports [7:0] and the data originally transmitted through the high-bit I/O ports [15:8], so that all the data sequentially enter the high and low selection module 50 (H_L_SEL), which selects that all data are transmitted through the low-bit I/O ports [7:0] controlled by the low-bit I/O ports [7:0] module 30. At this moment, the data of the X16 nonvolatile memory are outputted and inputted via the low-bit I/O ports [7:0] module 30, that is, the X16 nonvolatile memory is converted into the X8 nonvolatile memory. In this way, the user can use the X8 controller 10 to control the X16 nonvolatile memory.

The command register 20 receives the preset second user command, which transmits an enable signal X16_EN=1. After the high and low selection module 50 (H_L_SEL) and the high-bit I/O ports [15:8] module 40 receive the enable signal, the high-bit I/O ports [15:8] module 40 will make the path unblocked. All data in data register 60 will be inputted and outputted through the high-bit I/O ports [15:8] controlled by high-bit I/O ports [15:8] module 40 and the low-bit I/O ports [7:0] controlled by the low-bit I/O ports [7:0] module 30. In this way, the X16 nonvolatile memory that has been converted to the X8 mode will be converted back to the X16 nonvolatile memory. In the case where the X16 nonvolatile memory is connected to the X16 controller and operates in the X16 mode, even if the command register 10 receives the first user command for the mode conversion, the path of the high-bit I/O ports [15:8] module 40 will still be enabled rather than disabled, and the X16 nonvolatile memory still operates in the X16 mode. In addition, after the X16 nonvolatile memory is converted to the X8 mode, if the X16 nonvolatile memory is powered off, the path of the high-bit I/O ports [15:8] module 40 will be enabled again, and the X16 nonvolatile memory that has been converted to the X8 mode will be converted back to the X16 mode.

Through the above embodiment, the user can easily and conveniently convert the X16 nonvolatile memory to the X8 mode by a simple preset command and sending the command to the nonvolatile memory through the upper computer, such that the user has rich choices for using the nonvolatile memory.

Finally, it should also be noted that in this disclosure, relational terms such as "first" and "second" are used merely to distinguish one entity or operation from another. It does not necessarily require or imply any such actual relationship or order between these entities or operations. Furthermore, the term "comprising", "including" or any other variant thereof is intended to encompass a non-exclusive inclusion so that a process, method, article or terminal device that includes a series of elements not only includes the expressly listed elements but may also include other elements that are not expressly listed or are inherent to such process, method, article or terminal device. In the absence of more restrictions, the elements defined by the statement "including a . . . " do not exclude the presence of additional identical elements in the process, method, article or terminal device that includes the elements.

The above describes a mode conversion method and a mode apparatus for a nonvolatile memory provided by the present disclosure in detail. The principles and implementations of the present disclosure are described herein with specific examples. The above description of the embodiments is merely for assisting in understanding the method of the present disclosure and its core ideas. At the same time, for those skilled in the art, according to the idea of the present disclosure, there will be changes in specific implementations and applications. In summary, the content of this specification should not be construed as limiting the disclosure.

What is claimed is:

1. A mode conversion method for a nonvolatile memory, wherein the nonvolatile memory is in an X16 mode and has 16 input/output (I/O) ports, identified as I/O ports 0 to 15, wherein the I/O ports 8 to 15 are high-bit I/O ports and the I/O ports 0 to 7 are low-bit I/O ports, the method comprising:
    receiving a first user command that is sent by an upper computer and belongs to a user mode;
    determining a disabling command for a module path of the high-bit I/O ports 8 to 15 according to the first user command; and
    executing the disabling command and disabling the module path for controlling the high-bit I/O ports 8 to 15 in the X16 nonvolatile memory to make the X16 nonvolatile memory operate in an X8 mode.

2. The method according to claim 1, wherein the determining a disabling command for a module path of the high-bit I/O ports 8 to 15 according to the first user command, executing the disabling command and disabling the module path for controlling the high-bit I/O ports 8 to 15 in the X16 nonvolatile memory to make the X16 nonvolatile memory operate in the X8 mode comprises:
    parsing the first user command to obtain an address and a command for invoking a path disabling instruction;
    acquiring a corresponding address where the path disabling instruction is stored according to the address, and invoking the path disabling instruction, where the path disabling instruction is used for sending a disabling signal for disabling the module path of the high-bit I/O ports 8 to 15 in the X16 nonvolatile memory; and
    disabling the module path of the high-bit I/O ports 8 to 15 by the enable signal.

3. The method according to claim 1, wherein after the module path for controlling the high-bit I/O ports 8 to 15 in the X16 nonvolatile memory is disabled, data of the nonvolatile memory is inputted and outputted through the low-bit I/O ports 0 to 7,
    wherein after the X16 nonvolatile memory is converted into the X8 mode, the method further comprises:
        receiving a second user command that is sent by the upper computer and belongs to the user mode;
        determining an enabling command for the module path of the high-bit I/O ports 8 to 15 according to the second user command; and
        executing the enabling command and enabling the module path for controlling the high-bit I/O ports 8 to 15 of the X16 nonvolatile memory to make the X16 nonvolatile memory that has been converted to the X8 mode be converted back to the X16 mode.

4. The method according to claim 1, wherein after the X16 nonvolatile memory is converted into the X8 mode, the method further comprises:
    upon the X16 nonvolatile memory being powered off, enabling the module path for controlling the high-bit I/O ports 8 to 15 of the X16 nonvolatile memory, such that the X16 nonvolatile memory that has been converted to the X8 mode is converted back to the X16 mode.

5. A mode conversion apparatus for a nonvolatile memory, wherein the nonvolatile memory is in an X16 mode and has 16 I/O ports, identified as I/O ports 0 to 15, wherein the I/O ports 8 to 15 are high-bit I/O ports, and the I/O ports 0 to 7 are low-bit I/O ports, wherein the apparatus comprises: a first receiving module, a first determining module, and a first executing module;
    wherein the first receiving module is configured to receive a first user command that is sent by an upper computer and belongs to a user mode;
    the first determining module is configured to determine a disabling command for a module path of the high-bit I/O ports 8 to 15 according to the first user command; and
    the first executing module is configured to execute the disabling command and disables the module path for controlling the high-bit I/O ports 8 to 15 of the X16 nonvolatile memory to make the X16 nonvolatile memory operate in an X8 mode.

6. The apparatus according to claim 5, wherein the first determination module comprises: a parsing submodule and an addressing and invoking submodule;
    wherein the parsing submodule is configured to parse the first user command to obtain an address and a command for invoking a path disabling instruction; and
    the addressing and invoking submodule is configured to acquire, according to the address, a corresponding address where the path disabling instruction is stored; invoke the path disabling instruction; and disable the module path of the high-bit I/O ports 8 to 15 of the X16 nonvolatile memory though a disabling signal, wherein the path disabling instruction is used for sending the enable signal that controls the module path of the high-bit I/O ports 8 to 15 of the X16 nonvolatile memory to be disabled.

7. The apparatus according to claim 5, further comprising: a second receiving module, a second determining module and a second executing module;
    wherein the second receiving module is configured to receive a second user command that is sent by the upper computer and belongs to the user mode;
    the second determining module is configured to determine an enabling command for the module path of the high-bit I/O ports 8 to 15 according to the second user command; and
    the second executing module is configured to execute the enabling command to enable the module path for controlling the high-bit I/O ports 8 to 15 of the X16 nonvolatile memory, such that the X16 nonvolatile memory that has been converted to the X8 mode is converted back to the X16 mode for operation.

8. A nonvolatile memory, comprises:
a memory cell array;
16 input/output (I/O) ports, wherein the 16 I/O ports comprise high-bit I/O ports 8 to 15 and low-bit ports 8 to 7;
a controller, and
a module path, wherein the memory cell array is connected to the high-bit I/O ports 8 to 15 through the module path,
wherein the controller is configured to:
receive a first user command sent by a firmware in a user mode, wherein the firmware comprises 8 ports, and the 8 ports are connected to the low-bit ports 0 to 7;
determining a disabling command for the module path according to the first user command; and
executing the disabling command to disable the module path, such that the memory cell array is disconnected from the high-bit I/O ports 8 to 15.

9. The nonvolatile memory according to claim 8, wherein the controller is configured to:
parse the first user command to obtain an address and a command for invoking a path disabling instruction;
acquire the path disabling instruction according to the address;
invoke the path disabling instruction to trigger a disabling signal; and
disable the module path by the disabling signal.

10. The nonvolatile memory according to claim 8, wherein the controller is configured to:
receive a second user command sent by the firmware in the user mode;
determine an enabling command for the module path according to the second user command; and
execute the enabling command to enable the module path.

11. The nonvolatile memory according to claim 8, wherein after the module path is disabled, upon the nonvolatile memory being powered off, the controller is configured to enable the module path.

* * * * *